United States Patent [19]

Yamanaka

[11] Patent Number: 5,371,716
[45] Date of Patent: Dec. 6, 1994

[54] SEMICONDUCTOR MEMORY DEVICE AND OPERATING METHOD THEREFOR

[75] Inventor: Mutsumi Yamanaka, Hyogo, Japan

[73] Assignee: Mitsubishi Denki Kabushiki Kaisha, Tokyo, Japan

[21] Appl. No.: 977,970

[22] Filed: Nov. 18, 1992

[30] Foreign Application Priority Data

Feb. 3, 1992 [JP] Japan .................. 4-017671

[51] Int. Cl.⁵ .................. G11C 8/00; G11C 5/02
[52] U.S. Cl. .................. 365/233.5; 365/51; 365/63; 365/189.05
[58] Field of Search .............. 365/203, 205, 233.5, 365/189.05, 51, 63

[56] References Cited

U.S. PATENT DOCUMENTS

| 4,715,017 | 12/1987 | Iwahashi | 365/230.08 |
| 4,893,277 | 1/1990 | Kajigaya | 365/203 |
| 4,922,461 | 5/1990 | Hayakawa | 365/233.5 |
| 4,954,987 | 9/1990 | Auvinen | 365/189.05 |
| 5,043,947 | 8/1991 | Oshima | 365/230.03 |
| 5,068,831 | 11/1991 | Hoshi | 365/233.5 |

FOREIGN PATENT DOCUMENTS

| 48705 | 5/1987 | Japan . |
| 63-76191 | 4/1988 | Japan . |
| 49003 | 3/1990 | Japan . |

Primary Examiner—William L. Sikes
Assistant Examiner—Tiep Nguyen
Attorney, Agent, or Firm—Lowe, Price, LeBlanc & Becker

[57] ABSTRACT

Two sets of data buses, two equalizing circuits and two amplifying circuits are provided. A selection signal generating circuit generates selection signals for alternately selecting data buses. When the data bus is selected, the equalizing circuit is activated and the amplifying circuit is activated. The data bus is selected, the equalizing circuit is activated and the amplifying circuit is activated.

16 Claims, 10 Drawing Sheets

SEMICONDUCTOR MEMORY DEVICE AND OPERATING METHOD THEREFOR

BACKGROUND OF THE INVENTION

1. Field of the Invention

The present invention generally relates to semiconductor memory devices and operating method therefor, and more particularly, to an increase of an access speed of a semiconductor memory device.

2. Description of the Background Art

FIG. 8 is a block diagram showing a structure of a conventional dynamic random access memory (hereinafter referred to as a dynamic RAM).

In a dynamic RAM 100 in FIG. 8, a memory array 1 includes a plurality of bit line pairs BL, a plurality of word lines WL crossing the plurality of bit line pairs BL and a plurality of dynamic type memory cells MC provided at the crossings thereof. Each of the bit line pairs BL is connected to a data bus DB through a N channel MOS transistors 31 and 32 constituting a transfer gate.

A /RAS buffer 2 receives an externally applied row address strobe signal /RAS to generate a control signal $\phi_{/RAS}$. A /CAS buffer 3 receives an externally applied column address strobe signal /CAS to generate a control signal $\phi_{/CAS}$. A /WE buffer 4 receives an externally applied write enable signal /WE to generate a control signal $\phi_{/WE}$.

An X address buffer 5 receives externally applied address signals A0–An, and generates an X address signal XA in response to the control signal $\phi_{/RAS}$. An X address decoder 6 selects any one of a plurality of word lines WL in response to the X address signal XA.

A Y address buffer 7 receives externally applied address signals A0–An, and generates a Y address signal YA in response to the control signals $\phi_{/RAS}$ and $\phi_{/CAS}$. A Y address decoder 8 responds to the Y address signal YA to apply column selection signals C1 to Cm for selecting any one of a plurality of bit line pairs BL to the gates of transistors 31 and 32.

An ATD generating circuit 9 detects a transition of the Y address signal YA to generate a detection signal ATD. The detection signal ATD is a pulse signal. A signal generating circuit 10 responds to the detection signal ATD to generate an equalize signal EQ. A signal generating circuit 11 responds to the detection signal ATD to generate an amplifying circuit activation signal SE. A signal generating circuit 12 responds to the detection signal ATD to generate a Y address decoder activation signal DE.

A Din buffer 13 responds to the control signals $\phi_{/WE}$, $\phi_{/CAS}$ and $\phi_{/RAS}$ to apply an externally applied input data Din to the data bus DB. An equalizing circuit 14 responds to an activation signal EQ to equalize the potentials on the data bus DB. An amplifying circuit 15 responds to the activation signal SE to amplify the data on the data bus DB.

A signal generating circuit 16 responds to the control signals $\phi_{/CAS}$, $\phi_{/WE}$ to generate an output circuit activation signal OE. An output circuit 17 responds to the activation signal OE to provide the data amplified by the amplifying circuit 15 as an output data Dout.

Next, a normal reading operation of the dynamic RAM shown in FIG. 8 will be described with reference to a signal waveform diagram of FIG. 9.

The X address XA is applied to the X address decoder 6 in response to the fall of the row address strobe signal /RAS, whereby any one of a plurality of word lines WL is selected. As a result, data are read from a plurality of memory cells MC connected to the selected word line WL to the corresponding bit line pairs BL, respectively.

When address signals A0–An change from the X address XA to the Y address YA1, the detection signal ATD rises to a logic high or "H" level. The equalize signal EQ rises to "H" in response to the rise of the detection signal ATD, whereby the equalizing circuit 14 is activated and the potentials on the data bus DB are equalized. At the same time, the activation signal DE rises to "H", whereby the Y address decoder 8 is activated.

After a prescribed period of time, the detection signal ATD falls to a logic low or "L" level. The equalize signal EQ falls to "L" in response to the fall of the detection signal ATD, whereby equalization of the data bus DB is completed.

The Y address decoder 8 raises any one of the column selection signals C1 to Cm to "H", whereby one bit line pair BL is selected and the transistors 31 and 32 corresponding thereto are turned on. As a result, data is read to the data bus DB from the selected bit line pair BL.

In addition, the activation signal SE rises to "H" in response to the fall of the detection signal ATD, whereby the amplifying circuit 15 is activated and the data on the data bus DB is amplified. Data amplified by the amplifying circuit 15 is applied to the output circuit 17 at a high speed. After data is applied to the output circuit 17, the activation signal DE and the activation signal SE fall to "L" in order to suppress an operation current.

When the address signals A0–An change from the Y address YA1 to a Y address YA2, the detection signal ATD rises to "H", whereby, similarly the potentials on the data bus DB are equalized by the equalizing circuit 14, then data read to the data bus DB is amplified by the amplifying circuit 15, and the amplified data is applied to the output circuit 17 at a high speed.

When the activation signal OE rises to "H", the output circuit 17 is activated to provide the output data Dout.

Next, static column mode operation of the dynamic RAM shown in FIG. 8 will be described with reference to the signal waveform diagram of FIG. 10.

In the static column mode, data is accessed as Y address changes. When the column address strobe signal /CAS is "L", data is provided.

First, the X address XA is applied to the X address decoder 6 in response to the fall of the row address strobe signal /RAS, whereby any one of a plurality of word lines WL is selected. Then, data is read from a plurality of memory cells MC connected to the selected word line WL to the corresponding bit line pairs BL, respectively.

When address signals A0–An change from the X address XA to the Y address YA1, the detection signal ATD rises to "H". An activation signal EQ rises to "H" in response to the rise of the detection signal ATD, whereby the equalizing circuit 14 is activated and the potentials on the data bus DB are equalized. Simultaneously, the activation signal DE rises to "H", whereby the Y address decoder 8 is activated.

The detection signal ATD falls to "L" after a prescribed period of time. The equalized signal EQ falls to "L" in response to the fall of the detection signal ATD, whereby the equalization of the data bus DB is completed.

The Y address decoder 8 raises any one of the column selection signals C1-Cm to "H", whereby one bit line pair BL is selected and the transistors 31 and 32 corresponding thereto are turned on. As a result, data of the Y address YA1 is read from the selected bit line pair BL to the data bus DB.

In addition, the activation signal SE rises to "H" in response to the fall of the detection signal ATD, whereby the amplifying circuit 15 is activated and data on the data bus DB is amplified. Data amplified by the amplifying circuit 15 is applied to the output circuit 17 at a high speed. The activation signals DE and SE fall to "L" a prescribed period of time after the rise, respectively.

When the activation signal OE rises to "H", the output circuit 17 is activated, whereby data of the address YA1 is provided as the output data Dout.

When address signals A0-An change from the Y address YA1 to the Y address YA2, the detection signal ATD rises to "H", whereby the potentials on the data bus DB are equalized by the equalizing circuit 14 and, then data of a Y address YA3 read to the data bus DB is amplified by the amplifying circuit 15. In this case, the output circuit 17 is activated and data in the Y address YA2 is provided as an output data Dout.

In addition, when address signals A0-An change from the Y address YA2 to the Y address YA3, the detection signal ATD rises to "H", whereby the potentials on the data bus DB are equalized by the equalizing circuit 14, and then data in the Y address YA3 read to the data bus DB is amplified by the amplifying circuit 15. In this case, the output circuit 17 is activated and data in the Y address YA3 is provided as the output data Dout.

Thus, data is sequentially provided in response to the transition of the Y address.

As described above, in a conventional dynamic RAM, the potentials on the data bus DB are equalized after the detection signal ATD rises to "H". The amplifying circuit 15 cannot be operated until the equalization of the data bus DB is completed so that the potentials on the data bus DB are made to be the same. Therefore, access time of data is made to be longer by the time required for the equalization.

In the static column mode, data cannot be provided by the output circuit 17 until data on the data bus DB is amplified by the amplifying circuit 15. Therefore, the access time and the cycle time cannot be shortened.

SUMMARY OF THE INVENTION

An object of the present invention is to shorten an access time of a semiconductor memory device.

The other object of the present invention is to shorten the access time and a cycle time of a semiconductor memory device.

Still another object of the present invention is to enable the amplifying circuit to operate immediately after the transition of the address signal in the semiconductor memory device operating responsive to the transition of the address signal.

Still another object of the present invention is to shorten the access time in the reading operation in the dynamic RAM operating responsive to the transition of the address signal.

Yet another object of the present invention is to shorten the access time and the cycle time in the static column mode operation in a semiconductor memory device operating responsive to the transition of the address signal.

A semiconductor memory device according to the present invention includes a memory circuit for storing data, first and second data buses, a data bus selecting circuit, a connecting circuit, first and second potential setting circuits, first and second amplifying circuits and an activation circuit.

The first and second data buses transmit data read from the memory circuit. The data bus selecting circuit selects first and second data buses, alternately. The connecting means connects the data bus selected by the data bus selecting circuit to the memory circuit. The first potential setting circuit sets the first data bus to a predetermined potential. The second potential setting circuit sets the second data bus to a predetermined potential. The first amplifying circuit amplifies data on the first data bus. The second amplifying circuit amplifies data on the second data bus.

The activating circuit activates the second potential setting circuit and the first amplifying circuit when the first data bus is selected by the data bus selecting circuit, and activates the first potential setting circuit and the second amplifying circuit when the second data bus is selected by the data bus selecting circuit.

The semiconductor memory device may additionally include an address transition detecting circuit. The address transition detecting circuit detects the transition of externally applied address signals to generate a detection signal.

The data bus selecting circuit alternately generates the first selection signal for selecting the first data bus and the second selection signal for selecting the second data bus in response to the detection signal. The activating circuit activates the second potential setting circuit and the first amplifying circuit in response to the first selection signal, and activates the first potential setting circuit and the second amplifying circuit in response to the second selection signal.

The first data bus includes a first pair of data bus lines, and the second data bus includes a second pair of data bus lines. The first potential setting circuit includes a first equalizing circuit equalizing the potentials on the first pair of data bus lines, and the second potential setting circuit includes a second equalizing circuit equalizing the potentials on the second pair of data bus lines.

In the semiconductor memory device, the first and second data buses are alternately selected, and the selected data bus is connected to the memory circuit. When the first data bus is selected, the first amplifying circuit is activated, and data read to the first data bus from the memory circuit is amplified. In this case, the second potential setting circuit is activated, whereby the second data bus is set to a predetermined potential.

Conversely, when the second data bus is selected, the second amplifying circuit is activated, and data read to the second data bus from the memory circuit is amplified. In this case, the first potential setting circuit is activated, whereby the first data bus is set to a predetermined potential.

Thus, when one data bus is selected, the data bus has already been set to a predetermined potential in the previous cycle. Therefore, the data read to the data bus can be amplified immediately. Accordingly, an access time can be reduced.

That is to say, the first and second data buses are alternately selected, amplification of data on the selected data bus and potential setting of the unselected data bus are performed at the same time, whereby pipeline operation is available to shorten the access time.

A semiconductor memory device according to the other aspect of the present invention includes a memory circuit storing data, first and second data buses, a data bus selecting circuit, a connecting circuit, first and second amplifying circuits, first and second output circuits and an activating circuit.

The first and second data buses transmit data read from the memory circuit. The data bus selecting circuit alternately selects the first and second data buses. The connecting circuit connects the data bus selected by the data bus selecting circuit to the memory circuit.

The first amplifying circuit amplifies data on the first data bus. The second amplifying circuit amplifies data on the second data bus. The first output circuit provides data on the first data bus. The second output circuit provides data on the second data bus.

The activating circuit activates the first amplifying circuit and the second output circuit when the first data bus is selected by the data bus selecting circuit, and activates the second amplifying circuit and the first output circuit when the second data bus is selected by the data bus selecting circuit.

The semiconductor memory device may additionally include an address transition detecting circuit. The address transition detecting circuit detects the transition of an externally applied address signal to provide a detection signal.

The data bus selecting circuit responds to the detection signal to alternately generate the first selection signal selecting the first data bus and the second selection signal selecting the second data bus. The activating circuit activates the first amplifying circuit and the second output circuit in response to the first selection signal, and activates the second amplifying circuit and the first output circuit in response to the second selection signal.

The semiconductor memory device may also includes first and second potential setting circuits and a control circuit. The first potential setting circuit sets the first data bus to a predetermined potential, and the second potential setting circuit sets the second data bus to a predetermined potential. The control circuit activates the second potential setting circuit when the first data bus is selected by the data bus selecting circuit, and activates the first potential setting circuit when the second data bus is selected by the data bus selecting circuit.

In the semiconductor memory device, the first and second data buses are alternately selected, and the selected data bus is connected to the memory circuit. When the first data bus is selected, the first amplifying circuit is activated, and data read on the first data bus from the memory circuit is amplified. In this case, the second output circuit is activated, whereby the data on the second data bus amplified in the previous cycle is provided.

Conversely, when the second data bus is selected, the second amplifying circuit is activated, and data read to the second data bus from the memory circuit is amplified. In this case, the first output circuit is activated, whereby the data on the first data bus amplified in the previous cycle is provided.

Thus, when one data bus is selected, data on the other data bus has already been amplified in the previous cycle. Therefore, data on the other data bus can be provided immediately after the selection of one data bus to shorten the access time and the cycle time.

That is to say, the first and second data buses are alternately selected, and an amplification of data on the selected data bus and an output of data on an unselected data bus are performed at the same time, whereby pipeline operation is available to shorten the access time and the cycle time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
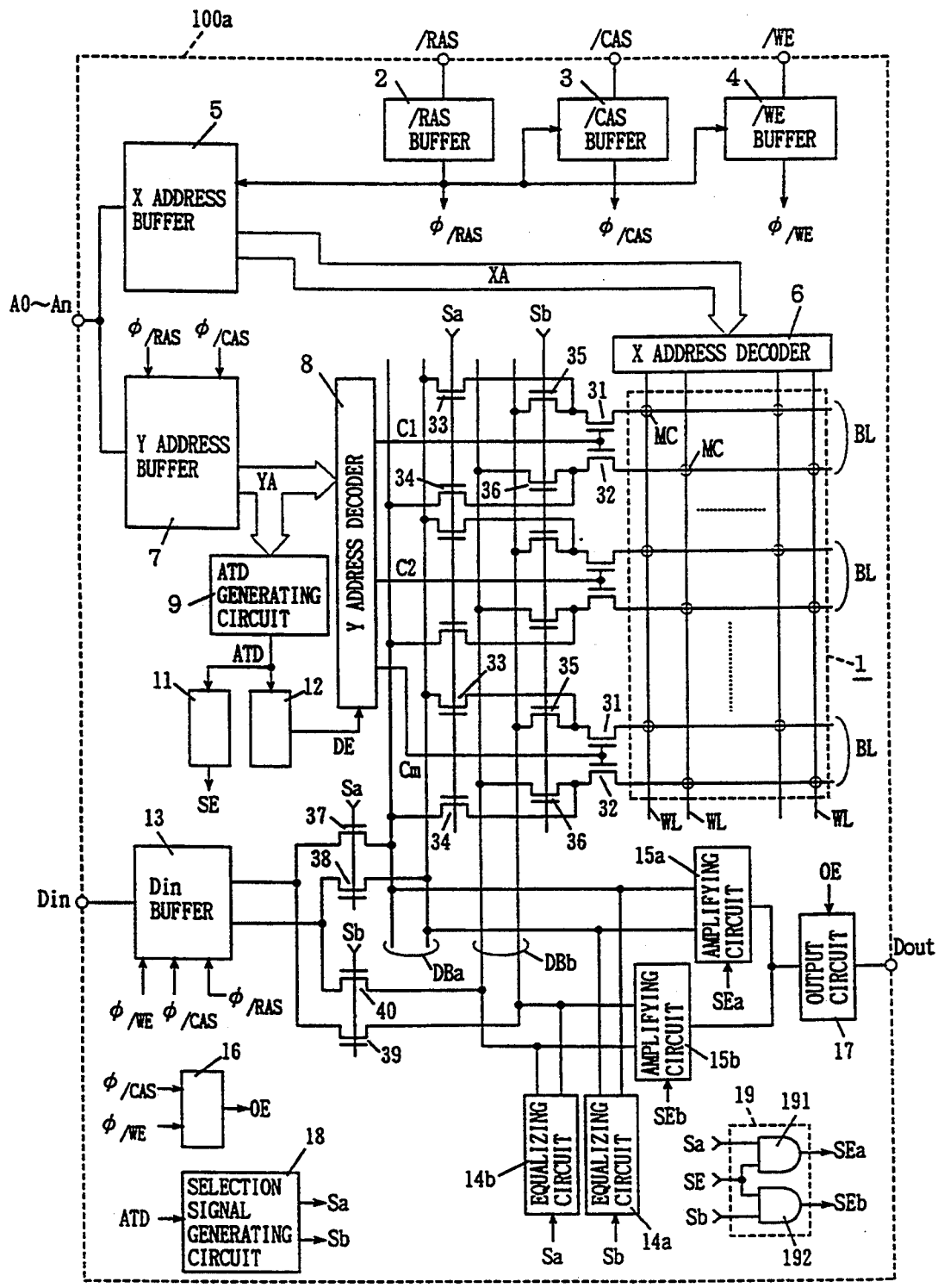
FIG. 1 is a block diagram showing a structure of a dynamic RAM according to a first embodiment of the present invention.

FIG. 1 is a block diagram showing a structure of a dynamic RAM according to the first embodiment of the present invention. A dynamic RAM 100a shown in FIG. 1 includes two sets of data buses DBa and DBb, two equalizing circuits 14a and 14b, and two amplifying circuits 15a and 15b. Each of the data buses DBa and DBb is comprised of two data bus lines.

The transistors 31 and 32 connected to each bit line pair BL are connected to the data bus DBa through N channel MOS transistors 33 and 34, and to the data bus DBb through N channel MOS transistors 35 and 36.

A Din buffer 13 is connected to the data bus DBa through N channel MOS transistors 37 and 38, and to the data bus DBb through N channel MOS transistors 39 and 40. The equalizing circuit 14a and the amplifying circuit 15a are connected to the data bus DBa, and the equalizing circuit 14b and the amplifying circuit 15b are connected to the data bus DBb. The output terminals of the amplifying circuits 15a and 15b are connected to an output circuit 17.

This dynamic RAM 100a further includes a selection signal generating circuit 18 and a signal generating circuit 19. The selection signal generating circuit 18 responds to a detection signal ATD to generate signals Sa and Sb. The selection signal Sa is applied to the gates of the transistors 33, 34, 37 and 38, and the equalizing circuit 14b. The selection signal Sb is applied to the gates of the transistors 35, 36, 39 and 40, and the equalizing circuit 14a.

The signal generating circuit 19a includes AND gates 191 and 192. The signal generating circuit 19a generates activation signals SEa and SEb in response to the selection signals Sa and Sb, and an activation signal SE. The activation signal SEa is applied to the amplifying circuit 15a, and the activation signal SEb is applied to the amplifying circuit 15b.

Figure 8:
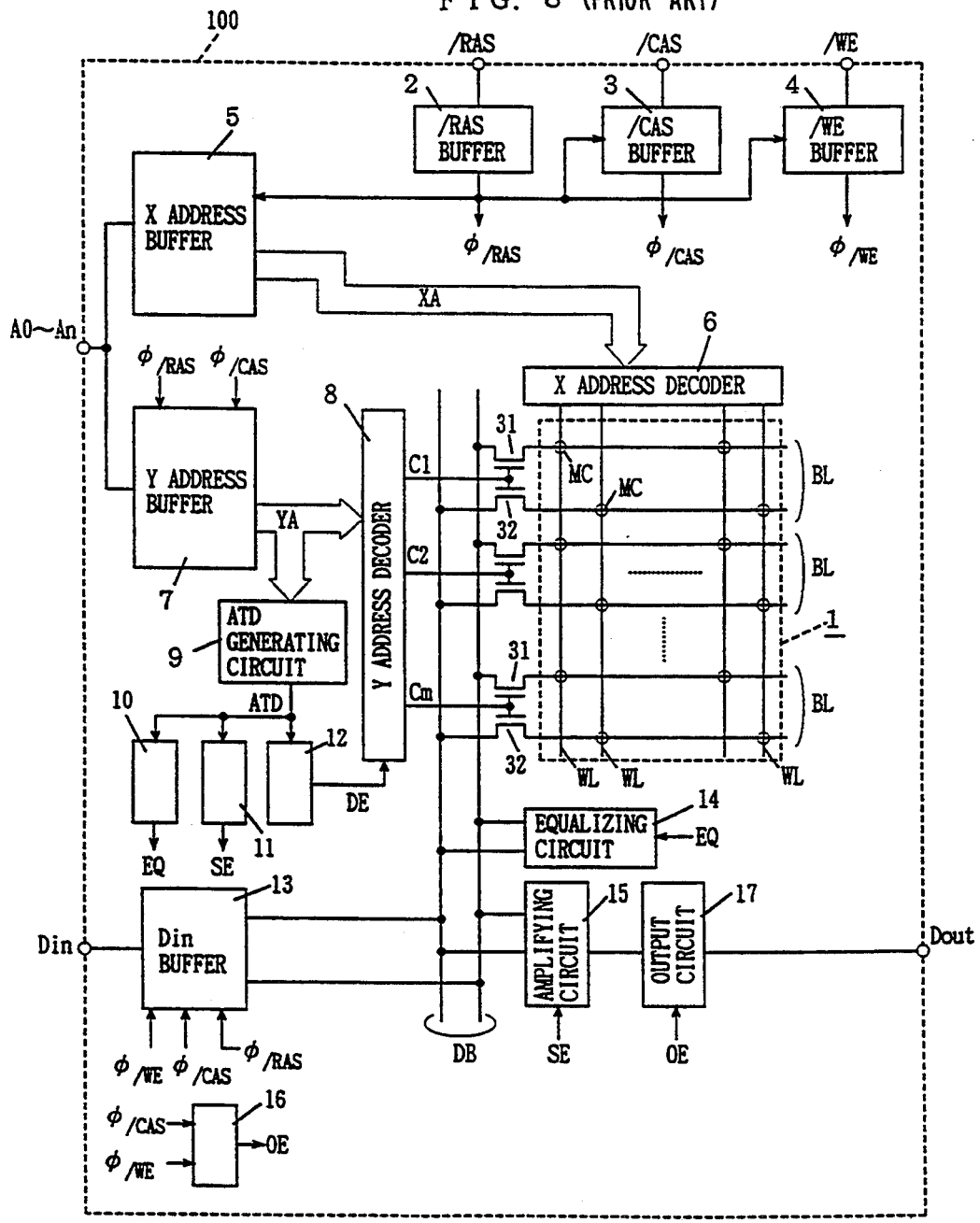
FIG. 8 is a block diagram showing a structure of a conventional dynamic RAM.
Figure 9:
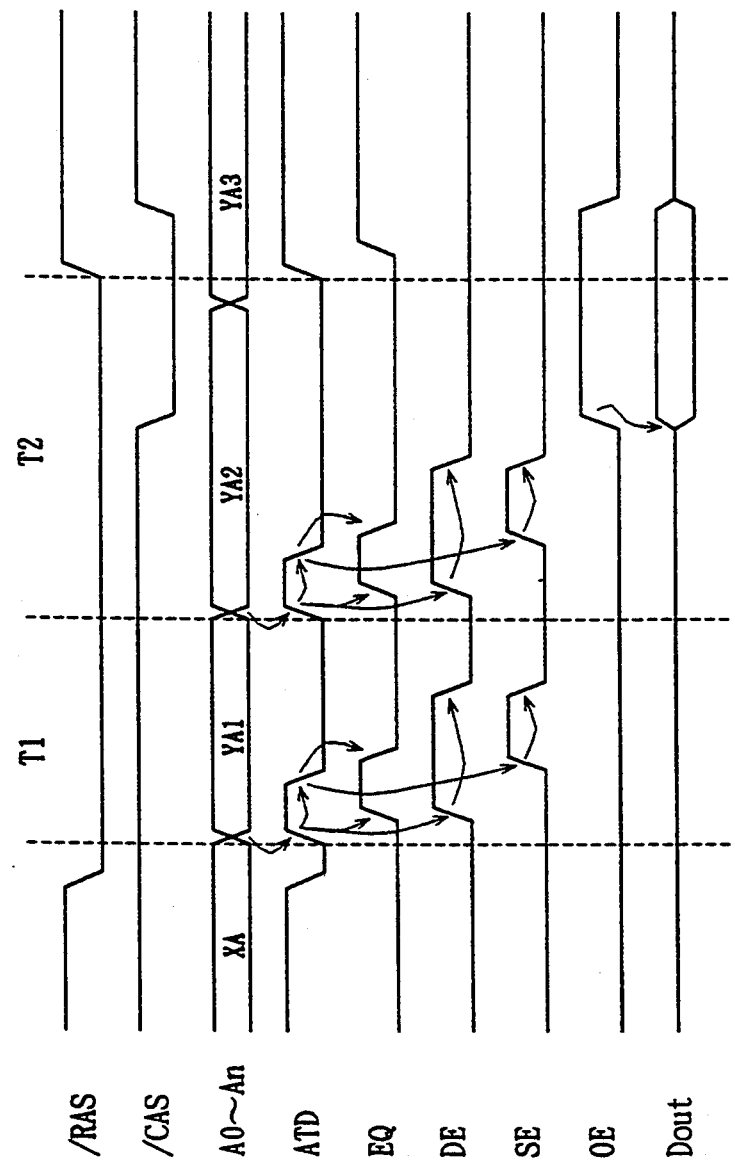
FIG. 9 is a signal waveform diagram showing a normal reading operation of the dynamic RAM of FIG. 8.
Figure 10:
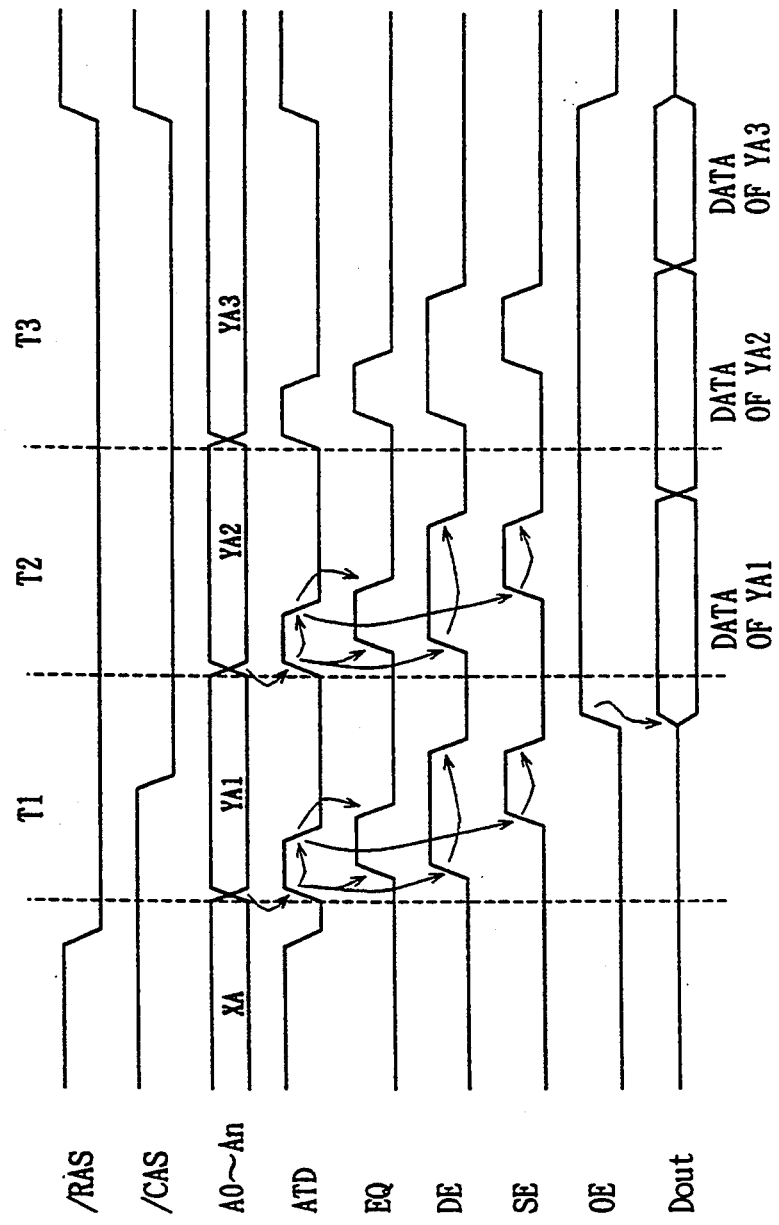
FIG. 10 is a signal waveform diagram showing a static column mode operation of the dynamic RAM of FIG. 8.

A structure of the other parts of this dynamic RAM 100a is the same as that of the corresponding parts of the dynamic RAM 100 shown in FIG. 8. This dynamic RAM 100a is formed of a single chip.

Figure 2:
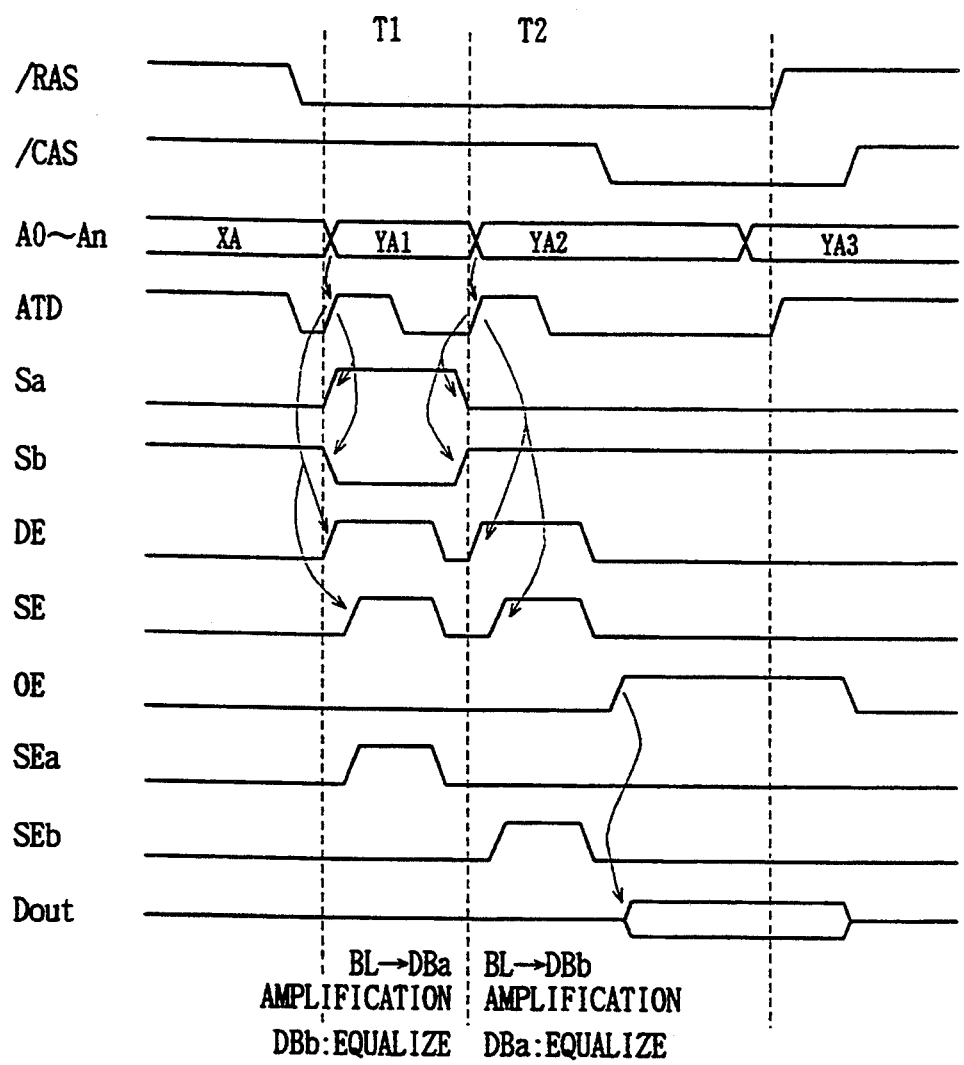
FIG. 2 is a signal waveform diagram showing a normal reading operation of the dynamic RAM of FIG. 1.

Next, a normal reading operation of the dynamic RAM 100a of FIG. 1 will be described with reference to the signal waveform diagram of FIG. 2.

When an X address XA is applied to an X address decoder 6 in response to the fall of a row address strobe signal /RAS, one of a plurality of word lines WL is selected, whereby data is read from a plurality of memory cells MC connected to the selected word line WL to the corresponding bit line pair BL, respectively.

When address signals A0–An change from the X address XA to a Y address YA1, the detection signal ATD rises to "H". The selection signal Sa rises to "H" and the selection signal Sb falls to "L" in response to the rise of the detection signal ATD, whereby the transistors 33, 34, 37 and 38 are turned on, and the transistors 35, 36, 39 and 40 are turned off. At the same time, the equalizing circuit 14a is rendered inactive and the equalizing circuit 14b is rendered active.

In addition, an activation signal DE rises to "H" in response to the rise of the detection signal ATD, whereby a Y address decoder 8 is activated. As a result, any one of column selection signals C1–Cm rises to "H". Then, any one of a plurality of bit line pairs BL is selected, and the corresponding transistors 31 and 32 are turned on, whereby data is read from the selected bit line pair BL to the data bus DBa. In this case, the data bus DBb is equalized to have the same potential by the equalizing circuit 14b.

The detection signal SEa rises to "H" a prescribed period of time after the rise of the detection signal ATD. Thus, the amplifying circuit 15a is activated, so that data on the data bus DBa is amplified and the amplified data is applied to the output circuit 17 at a high speed. In this case, the activation signal SEb remains "L". Therefore, the amplifying circuit 15b remains inactive. The detection signal ATD falls to "L" a prescribed period of time after the rise. Similarly, the activation signals DE and SEa fall to "L" after a prescribed period of time, respectively.

When the address signals A0–An change from the Y address YA1 to a Y address YA2, the detection signal ATD rises to "H". The selection signal Sa falls to "L" and the selection signal Sb rises to "H" in response to the fall of the detection signal ATD, whereby the transistors 33, 34, 37 and 38 are turned off, and the transistors 35, 36, 39 and 40 are turned on. At the same time, the equalizing circuit 14a is rendered active, and the equalizing circuit 14b is rendered inactive.

In addition, the activation signal DE rises to "H" in response to the rise of the detecting signal ATD, whereby the Y address decoder 8 is activated and any one of the column selection signals C1–Cm rises to "H". As a result, any one of a plurality of bit line pairs BL is selected, and the corresponding transistor 31 and 32 are turned on, whereby data is read from the selected bit line pair BL to the data bus DBb. In this case, the data bus DBa is equalized to have the same potential by the equalizing circuit 14a.

The activation signal SEb rises to "H" a prescribed period of time after the rise of the detection signal ATD. Thus, the amplifying circuit 15b is activated, so that data on the data bus DBb is amplified and the amplified data is applied to the output circuit 17 at a high speed. In this case, the activation signal SEa remains "L". Therefore, the amplifying circuit 15a remains inactive. The detection signal ATD falls to "L" a prescribed period of time after the rise. Similarly, the activation signals DE and SEb fall to "L" after a prescribed time, respectively.

An output enable signal OE rises to "H" in response to the fall of a column address strobe signal /CAS, whereby the output circuit 17 is activated, and the data amplified by the amplifying circuit 15b is provided as an output data Dout.

As described above, in a period T1, data read from the selected bit line pair BL to the data bus DBa is amplified, and the potentials on the data bus DBb are equalized. In a period T2, data read from the selected bit line pair BL to the data bus DBb is amplified, and potentials on the data bus DBa are equalized. Operations during the periods T1 and T2 are alternately repeated as the Y address changes.

In the embodiment described above, since the amplifying circuit can be activated immediately after the transition of the Y address, the access time can be shortened.

Figure 3:
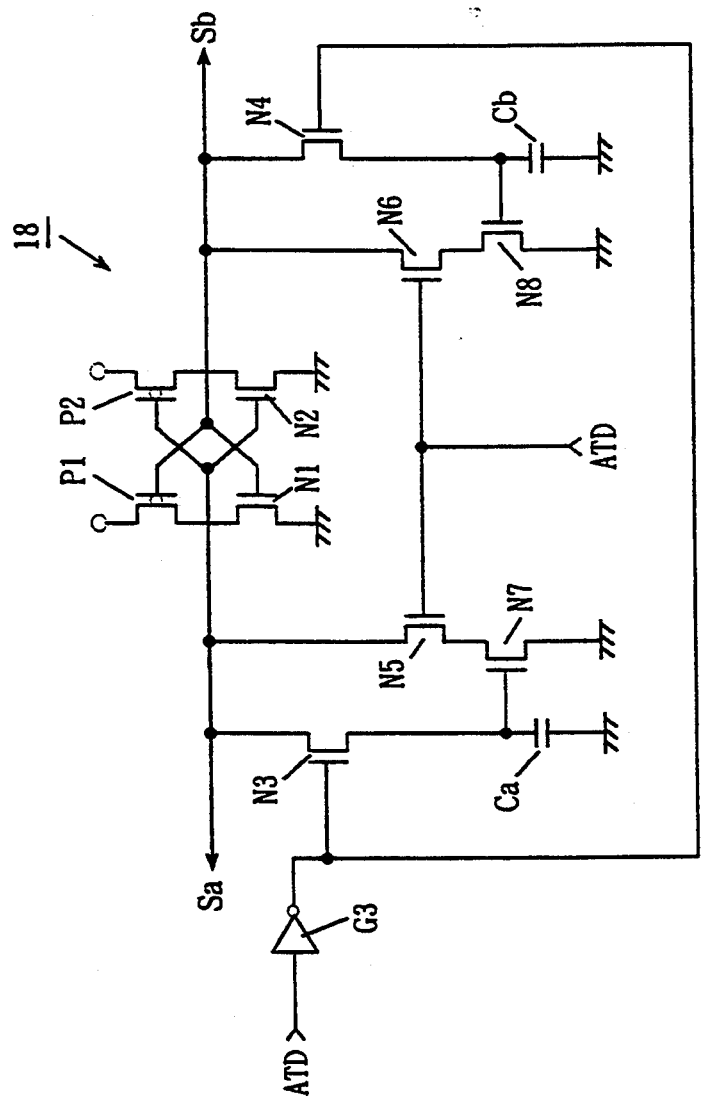
FIG. 3 is a schematic diagram of a circuit showing a detailed structure of a selection signal generating circuit.

FIG. 3 is a schematic diagram of a circuit showing a detailed structure of the selection signal generating circuit 18. The selection signal generating circuit 18 includes P channel MOS transistors P1 and P2, N channel MOS transistors N1–N8, and an inverter G3 and capacitors Ca and Cb. A differential amplifier consists of transistors P1, P2, N1 and N2.

Now, it is assumed that the selection signal Sa is at "H" and the selection signal Sb is at "L" When the detection signal ATD is at "L", the output of the inverter G3 is at"H", whereby the transistors N3 and N4 are turned on. Therefore, the transistor N7 is turned on, and the transistor N8 is turned off. In this case, the transistors N5 and N6 are turned off.

When the detection signal ATD rises to"H", the output of the inverter G3 becomes "L", whereby the transistors N3 and N4 are turned off and, in addition, the transistors N5 and N6 are turned on. As a result, the selection signal Sa falls to "L", and the selection signal Sb rises to"H". Thus, the selection signals Sa and Sb alternately change to "H" as the detection signal ATD rises to"H".

Figure 4:
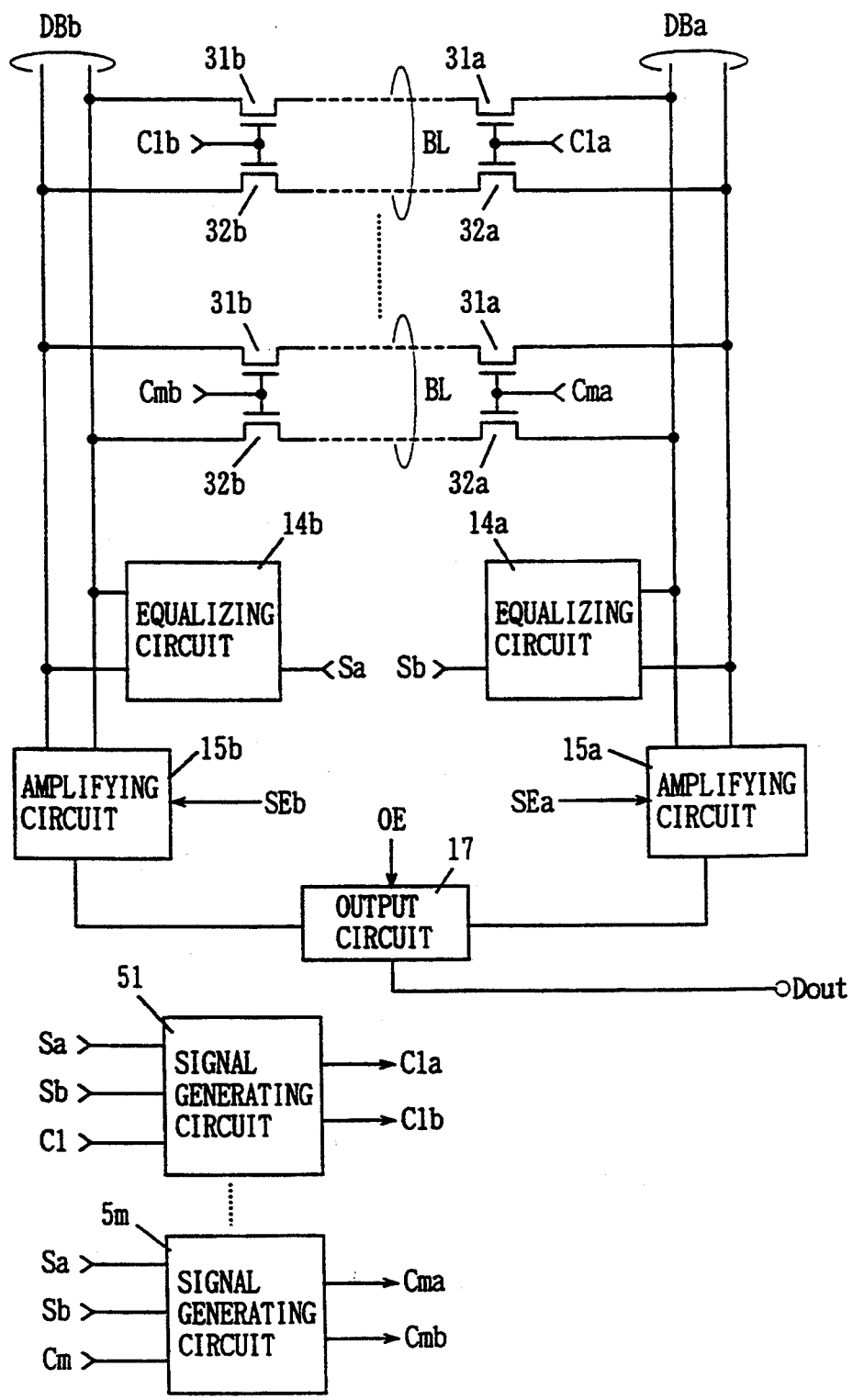
FIG. 4 is a diagram showing a structure of a main part of the dynamic RAM according to a second embodiment of the present invention.

FIG. 4 is a diagram showing a structure of a main part of the dynamic RAM according to the second embodiment of the present invention. The difference between the dynamic RAM shown in FIG. 4 and the dynamic RAM 100a of FIG. 1 will be described hereinafter.

The data bus DBa is disposed at one end side of a plurality of bit line pairs BL, and the data bus DBb is disposed at the other end side of the plurality of bit line pairs BL. One end of each bit line pair BL is connected to the data bus DBa through the N channel MOS transistors 31a and 32a, and the other end of each bit line pair BL is connected to the data bus DBb through the N channel MOS transistors 31b and 32b.

In addition, a plurality of signal generating circuits 51-5m are provided. Each signal generating circuit 5i (i=1-m) generates column selection signals Cia and Cib (i=1-m) in response to the selection signals Sa and Sb, and the column selection signal Ci (i=1-m). The gates of the transistors 31a and 32a are supplied with the column selection signal Cia, and the gates of the transistors 31b and 32b are supplied with the column selection signal Cib.

A structure of the other parts of the dynamic RAM shown in FIG. 4 is the same as that of the dynamic RAM 100a of FIG. 1.

Figure 5:
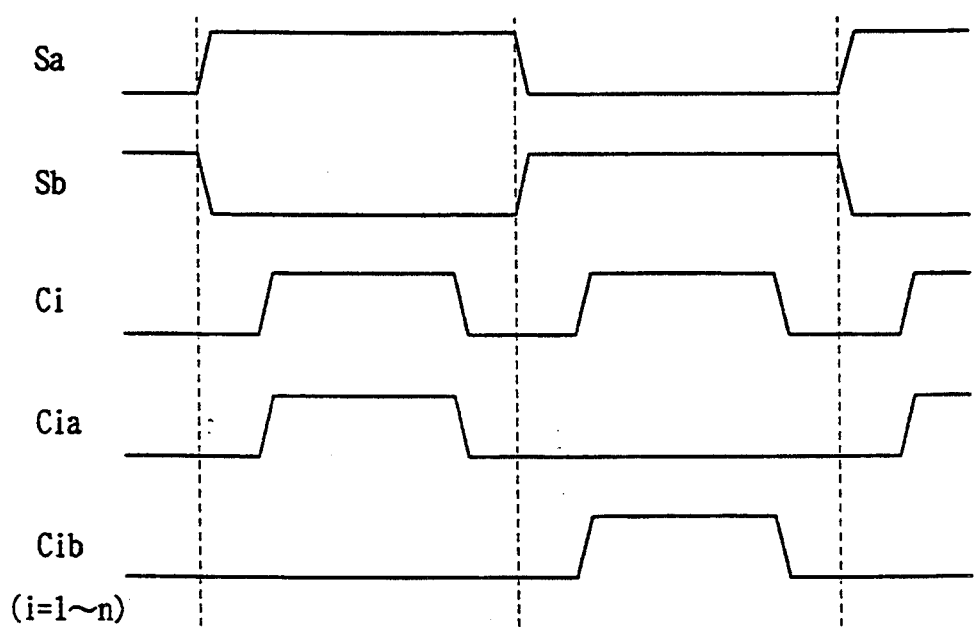
FIG. 5 is a signal waveform diagram showing the operation of the dynamic RAM of FIG. 4.

As shown in FIG. 5, when the selection signal Sa rises to "H", the selection signal Sb falls to "L". Any one of the column selection signals C1-Cm, Ci rises to "H" a prescribed period of time after the rise of the selection signal Sa, whereby the column selection signal Cia rises to "H". In this case, the column selection signal Cib remains "L". Therefore, the selected bit line pair BL is connected to the data bus DBa.

When the selection signal Sa falls to "L", the selection signal Sb rises to "H". Any one of the column selection signals C1-Cm, Ci rises to "H" a prescribed period of time after the rise of the selection signal Sb, whereby the selection signal Cib rises to "H". In this case, the column selection signal Cia remains "L". Therefore, the selected bit line pair BL is connected to the data bus DBb. The operation described above will alternately be repeated.

According to the embodiment shown in FIG. 4, the transistors 31 and 32 in the embodiment of FIG. 1 can be eliminated.

Figure 6:
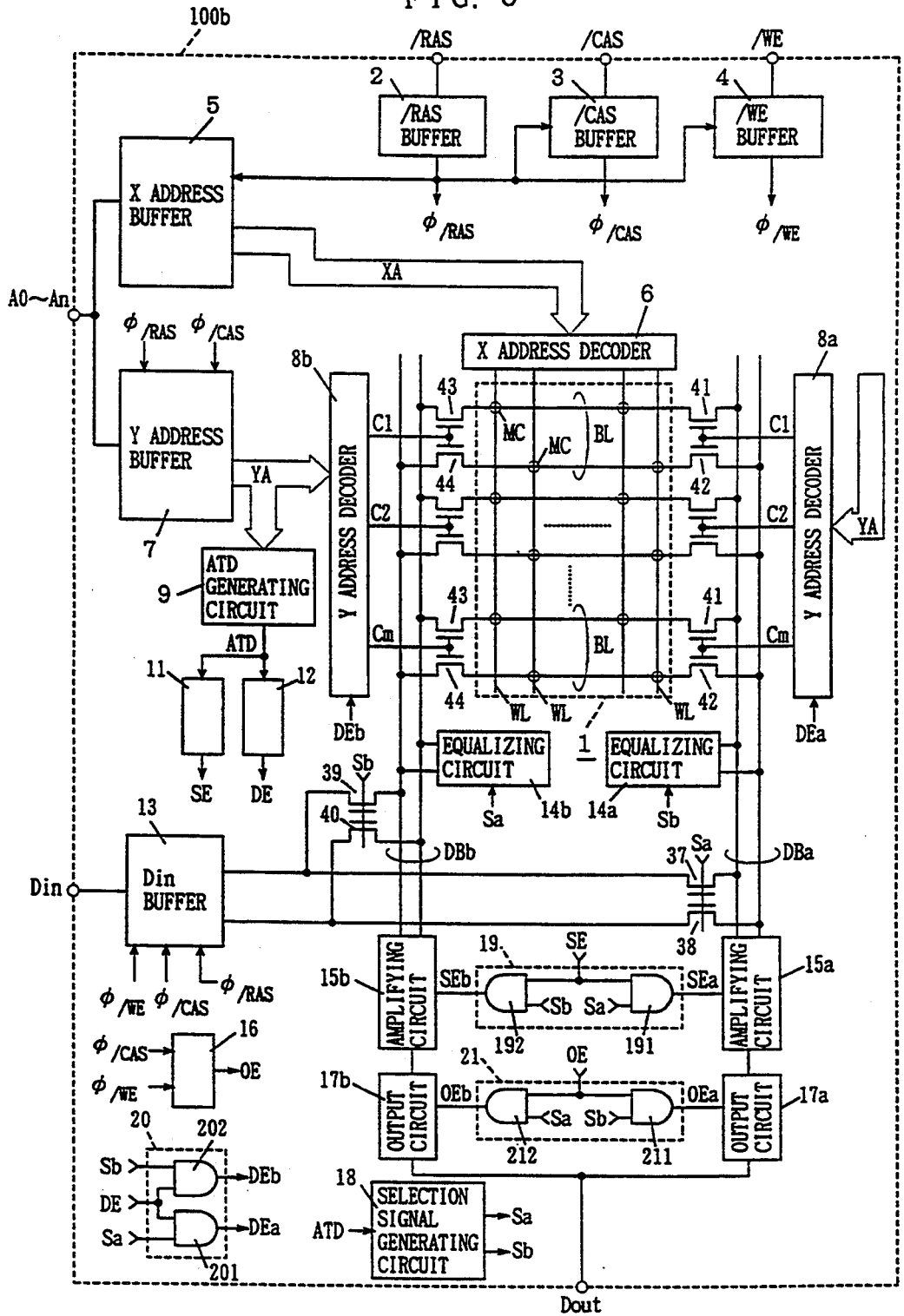
FIG. 6 is a block diagram showing the structure of the dynamic RAM according to a third embodiment of the present invention.

FIG. 6 is a block diagram showing a structure of the dynamic RAM according to the third embodiment of the present invention.

A dynamic RAM 100b shown in FIG. 6 includes two sets of data buses DBa and DBb, two Y address decoders 8a and 8b, two equalizing circuits 14a and 14b, two amplifying circuits 15a and 15b, and two output circuits 17a and 17b.

The data bus DBa and the Y address decoder 8a are disposed at one end side of a plurality of bit line pairs BL. The data bus DBb and the Y address decoder 8b are disposed at the other end side of a plurality of bit line pairs BL. One end of each bit line pair BL is connected to the data bus DBa through N channel MOS transistors 41 and 42. The other end of each bit line pair BL is connected to the data bus DBb through N channel MOS transistors 43 and 44.

The column selection signal Ci (i=1-m) provided from the Y address decoder 8a is applied to the gates of the corresponding transistors 41 and 42. The column selection signal Ci (i=1-m) provided from the Y address decoder 8b is applied to the gates of the corresponding transistors 43 and 44.

The Din buffer 13 is connected to the data bus DBa through the N channel MOS transistors 37 and 38, and to the data bus DBb through the N channel MOS transistors 39 and 40. The equalizing circuit 14a and the amplifying circuit 15a are connected to the data bus DBa, and the equalizing circuit 14b and the amplifying circuit 15b are connected to the data bus DBb. The output terminal of the amplifying circuit 15a is connected to the output circuit 17a, and the output terminal of the amplifying circuit 15b is connected to the output circuit 17b. The output terminals of the output circuits 17a and 17b are connected to a common output terminal.

This dynamic RAM 100b further includes a selection signal generating circuit 18 and signal generating circuits 19, 20 and 21. The selection signal generating circuit 18 generates the selection signals Sa and Sb in response to the detection signal ATD. The signal generating circuit 19 includes AND gates 191 and 192. The signal generating circuit 20 includes AND gates 201 and 202. The signal generating circuit 21 includes AND gates 211 and 212.

The signal generating circuit 19 generates the activation signals SEa and SEb in response to the selection signals Sa and Sb, and the activation signal SE. The signal generating circuit 20 generates activation signals DEa and DEb in response to the selection signals Sa and Sb, and the activation signal DE. The signal generating circuit 21 generates output enable signals OEa and OEb in response to the selection signals Sa and Sb, and an output enable signal OE.

The selection signal Sa is applied to the gates of the transistor 37 and 38, and the selection signal Sb is applied to the gates of the transistors 39 and 40. In addition, the selection signal Sb is applied to the equalizing circuit 14a, and the selection signal Sa is applied to the equalizing circuit 14b. The activation signal SEa is applied to the amplifying circuit 15a, and the activation signal SEb is applied to the amplifying circuit 15b. The output enable signal OEa is applied to the output circuit 17a, and the output enable signal OEb is applied to the output circuit 17b.

Figure 7:
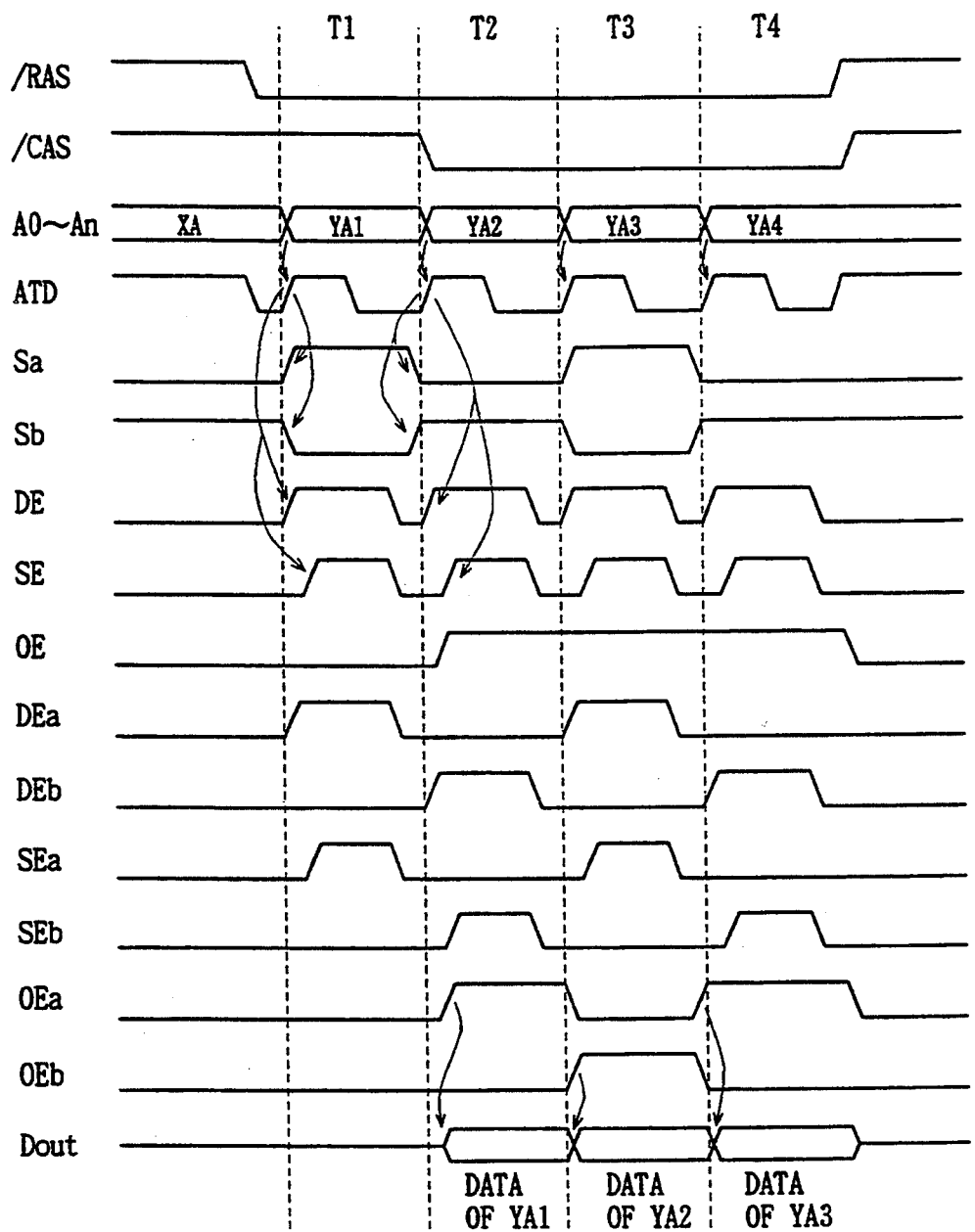
FIG. 7 is a signal waveform diagram showing a static column mode operation of the dynamic RAM of FIG. 6.

Next, the static column mode operation of the dynamic RAM 100b shown in FIG. 6 will be described with reference to the signal waveform diagram shown in FIG. 7.

The X address XA is applied to the X address decoder 6 in response to the fall of the row address strobe signal /RAS, whereby any one of a plurality of word lines WL is selected, and data is read from a plurality of memory cells MC connected to the selected word line WL to the corresponding bit line pairs BL, respectively.

When the address signals A0-An change from the X address Xa to the Y address YA1, the detection signal ATD rises to "H". The selection signal Sa rises to "H" and the selection signal Sb falls to "L" in response to the rise of the detection signal ATD, whereby the transistors 37 and 38 are turned on, and the transistors 39 and 40 are turned off. At the same time, the equalizing circuit 14a is rendered inactive and the equalizing circuit 14b is rendered active.

In addition, the activation signal DEa rises to "H" in response to the rise of the detection signal ATD, whereby the Y address decoder 8a is activated, and any one of the column selection signals C1-Cm rises to "H". As a result, the corresponding transistors 41 and 42 are turned on and data is read from the selected bit line pair BL to the data bus DBa. In this case, the activation signal DEb remains "L" and, therefore the Y address decoder 8b remains inactive.

The activation signal SEa rises to "H" a prescribed period of time after the rise of the detection signal ATD, whereby the amplifying circuit 15a is activated and data on the data bus DBa is amplified. The amplified data is applied to the output circuit 17a at a high speed. In this case, the activation signal SEb remains "L" and, therefore the amplifying circuit 15b remains inactive.

The detection signal ATD falls to "L" a prescribed period of time after the rise. In addition, the activation signals DEa and SEa fall to "L" after a prescribed period of time, respectively.

When the address signals A0-An change from the Y address YA1 to the Y address YA2, the detection signal ATD rises to "H". The selection signal Sa falls to "L" and the selection signal Sb rises to "H" in response to the rise of the detection signal ATD, whereby the transistors 37 and 38 are turned off, and the transistors 39 and 40 are turned on. At the same time, the equalizing circuit 14a is rendered active, and the equalizing circuit 14b is rendered inactive.

In addition, the activation signal DEb rises to "H" in response to the rise of the detection signal ATD, whereby the Y address decoder 8b is activated and any one of the column selection signals C1-Cm rises to "H". As a result, the corresponding transistors 43 and 44 are turned on, and data is read from the selected bit line pair BL to the data bus DBb. In this case, the activation signal DEa remains "L" and, therefore, the Y address decoder 8a remains inactive.

The activation signal SEb rises to "H" a prescribed period of time after the rise of the detection signal ATD, whereby the amplifying circuit 15b is activated, and data on the data bus DBb is amplified. The amplified data is applied to the output circuit 17b at a high speed. In this case, the activation signal SEa remains "L" and, therefore, the amplifying circuit 15a remains inactive.

The output enable signal OE rises to "H" in response to the fall of the column address strobe signal /CAS, whereby the output enable signal OEa rises to "H". As a result, the output circuit 17a is activated, and data of the Y address YA1 amplified by the amplifying circuit 15a in the previous cycle (period T1) is provided. In this case, the output enable signal OEb remains "L" and, therefore, the output circuit 17b remains inactive.

The detection signal ATD falls to "L" a prescribed period of time after the rise. In addition, the activation signal DEb and the activation signal SEb fall to "L" after a prescribed period of time, respectively.

When the address signals A0-An change from the Y address YA2 to a Y address YA3, the detection signal ATD rises to "H", whereby the selection signal Sa rises to "H" and the selection signal Sb falls to "L".

In a period T3, similarly to the period T1, the equalizing circuit 14b is activated and potentials on the data bus DBb are equalized. In addition, the amplifying circuit 15a is activated and data read on the data bus DBa is amplified and, then the amplified data is applied to the output circuit 17a at a high speed.

The output enable signal OEa falls to "L" and the output enable signal OEb rises to "H" in response to the rise of the detection signal ATD, whereby the output circuit 17a is rendered inactive and the output circuit 17b is rendered active. As a result, data of the Y address YA2 amplified in the previous cycle (period T2) is provided.

Similarly, in a period T4, data of the Y address YA3 amplified in the period T3 is provided through the output circuit 17a.

As described above, in the period T1, data of the Y address YA1 read to the data bus DBa is amplified by the amplifying circuit 15a, and the data bus DBb is equalized to have the same potential by the equalizing circuit 14b. In the period T2, data of the Y address YA2 read to the data bus DBb is amplified by the amplifying circuit 15b, and the data bus DBa is equalized to have the same potential by the equalizing circuit 14a. In this case, data of the Y address YA1 amplified in the period T1 is provided through the output circuit 17a at a high speed.

In the period T3, data of the Y address YA3 read to the data bus DBa is amplified by the amplifying circuit 15a, and the data bus DBb is equalized to have the same potential by the equalizing circuit 14b. In this case, data of the Y address YA2 amplified in the period T3 is provided through the output circuit 17b at a high speed.

In the period T4, data of a Y address YA4 read to the data bus DBb is amplified by the amplifying circuit 15b, and the data bus DBa is equalized to have the same potential by the equalizing circuit 14a. In this case, data of the Y address YA3 amplified in the period T3 is provided through the output circuit 17a at a high speed.

In the embodiments described above, when the Y address changes, data amplified in the previous cycle has already been applied to the output circuit and, therefore, the access time and the cycle time can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array having a plurality of memory cells for storing data;
   a first data bus transmitting the data read from any of the plurality of memory cells of said memory array;
   a second data bus transmitting the data read from any of the plurality of memory cells of said memory array;
   data bus selecting means for alternately selecting said first and second data buses;
   connecting means for connecting the data bus selected by said data bus selecting means to said memory array;
   first potential setting means for setting said first data bus to a predetermined potential;
   second potential setting means for setting said second data bus to a predetermined potential;
   first amplifying means for amplifying data on said first data bus;
   second amplifying means for amplifying data on said second data bus; and
   activating means for alternately activating said first and second amplifying means, wherein
   the second potential setting means sets the second data bus to a predetermined potential and the activating means activates the first amplifying means when said first data bus is selected by said data bus selecting means, and
   the first potential setting means sets the first data bus to a predetermined potential and the activating means activates the second amplifying means when said second data bus is selected by said data bus selecting means.

2. The semiconductor memory device according to claim 1, further comprising address transition detecting means for detecting a transition of an externally applied address signal to generate a detection signal, wherein said data bus selecting means responds to said detection signal to alternately generate a first selection signal selecting said first data bus and a second selection signal selecting said second data bus, said second potential setting means sets the second data bus to a predetermined potential and said activating means activates said first amplifying means in response to said first selection signal, and said first potential setting means sets the first data bus to a predetermined potential and activates said second amplifying means in response to said second selection signal.

3. The semiconductor memory device according to claim 1, wherein said first data bus comprises a first pair of data bus lines, said second data bus comprises a second pair of data bus lines, said first potential setting means comprises first equalizing means for equalizing potentials on said first pair of data bus lines, and said second potential setting means comprises second equalizing means for equalizing potentials on said second pair of data bus lines.

4. The semiconductor memory device according to claim 3, wherein said memory array comprises a plurality of bit lines, and a plurality of word lines crossing said plurality of bit lines, said plurality of memory cells provided at the crossing of said plurality of bit lines and said plurality of word lines, said plurality of bit lines constitute a plurality of bit line pairs, and said connecting means connects the data bus selected by said data bus selecting means to said plurality of bit line pairs.

5. The semiconductor memory device according to claim 4, wherein said connecting means comprises bit line selecting means, responsive to an externally applied address signal, for selecting any of said plurality of bit line pairs, a plurality of transfer gate means, provided corresponding to said plurality of bit line pairs, each connected to one end of the corresponding bit line pair and controlled by said bit line selecting means, a plurality of first switching means, provided corresponding to said plurality of transfer gate means, each connected between said first data bus and the corresponding transfer gate means and controlled by said data bus selecting means, and a plurality of second switching means, provided corresponding to said plurality of transfer gate means, each connected between said second data bus and the corresponding transfer gate means and controlled by said data bus selecting means.

6. The semiconductor memory device according to claim 4, wherein said connecting means comprises bit line selecting means for selecting any of said plurality of bit line pairs in response to an externally applied address signal, a plurality of first transfer gate means, provided corresponding to said plurality of bit line pairs, each connected between said first data bus and one end of the corresponding bit line pair, and a plurality of second transfer gate means, provided corresponding to said plurality of bit line pairs, each connected between said second data bus and another end of the corresponding bit line pair, wherein a respective first transfer gate means is activated to transfer data between the first data bus and said corresponding bit line pair in response to selection of the first data bus by said data bus selection means, and a respective second transfer gate means is activated to transfer data between the second data bus and said corresponding bit line pair in response to selection of the second data bus by said data bus selection means.

7. The semiconductor memory device according to claim 1, wherein said memory array comprises a dynamic random access memory.

8. A semiconductor memory device, comprising:

a memory array having a plurality of memory cells for storing data;

a first data bus transmitting data read from any of the plurality of memory cells of said memory array;

a second data bus transmitting data read from any of the plurality of memory cells of said memory array;

data bus selecting means for alternately selecting said first and second data buses;

connecting means for connecting the data bus selected by said data bus selecting means to said memory array;

first amplifying means for amplifying data on said first data bus;

second amplifying means for amplifying data on said second data bus;

first output means for outputting data on said first data bus;

second output means for outputting data on second data bus; and activating means for activating said first amplifying means and said second output means when said first data bus is selected by said data bus selecting means, and activating said second amplifying means and said first output means when said second data bus is selected by said data bus selecting means.

9. The semiconductor memory device according to claim 8, further comprising address transition detecting means for detecting a transition of an externally applied address signal to generate a detection signal, wherein said data bus selecting means alternately generates a first selection signal selecting said first data bus and a second selection signal selecting said second data bus, and said activating means activates said first amplifying means and said second output means in response to said first selection signal, and activates said second amplifying means and said first output means in response to said second selection signal.

10. The semiconductor memory device according to claim 8, wherein said first data bus comprises a first pair of data bus lines, said second data bus comprises a second pair of data bus lines, said memory array comprises:

a plurality of bit lines, and a plurality of word lines crossing said plurality of bit lines, said plurality of memory cells provided at the crossing of said plurality of bit lines and said plurality of word lines, and wherein said plurality of bit lines constitute a plurality of bit line pairs, and said connecting means connects the data bus selected by said data bus selecting means to any of said plurality of bit line pairs.

11. The semiconductor memory device according to claim 10, wherein said connecting means comprises a plurality of first transfer gate means, provided corresponding to said plurality of bit line pairs, each connected between said first data bus and one end of the corresponding bit line pair, a plurality of second transfer gate means, provided corresponding to said plurality of bit line, each connected between said second data bus and another end of the corresponding bit line pair, first bit line selecting means, responsive to an externally applied address signal, for selecting any of said plurality of bit line pairs to turn on the corresponding first transfer gate means, second bit line selecting means, responsive to an externally applied address signal, for selecting any of said plurality of bit line pairs to turn on the corresponding second transfer gate means, and controlling means for activating said first bit line selecting means when said first data bus is selected by said data bus selecting means, and activating said second bit line selecting means when said second data bus is selected by said data bus selecting means.

12. The semiconductor memory device according to claim 8, further comprising:

first potential setting means for setting said first data bus to a predetermined potential, and second potential setting means for setting said second data bus to a predetermined potential, wherein said second potential setting means is activated when said first data bus is selected by said data bus selecting means, and said first potential setting means is activated when said second data bus is selected by said data bus selecting means.

13. The semiconductor memory device according to claim 8, wherein said memory array comprises a dynamic random access memory.

14. An operating method for a semiconductor memory device comprising a memory array having a plurality of memory cells for storing data, a first data bus transmitting data read from any of the plurality of memory cells of said memory array and a second data bus transmitting data read from any of the plurality of memory cells of said memory array, comprising the steps of:

alternately selecting said first and second data buses;

connecting said first data bus to said memory array when said first data bus is selected, and connecting said second data bus to said memory array when said second data bus is selected;

setting said second data bus to a predetermined potential when said first data bus is selected, and setting said first data bus to a predetermined potential when said second data bus is selected; and amplifying data on said first data bus when said first data bus is selected, and amplifying data on said second data bus when said second data bus is selected.

15. An operating method for a semiconductor memory device comprising a memory array having a plurality of memory cells for storing data, a first data bus transmitting the data read from any of the plurality of memory cells of said memory array, and a second data bus transmitting the data read from any of the plurality of memory cells of said memory array, comprising the steps of:

alternately selecting said first and second data buses;

amplifying the data on said first data bus when said first data bus is selected, and amplifying the data on said second data bus when said second data bus is selected; and outputting the data on said second data bus when said first data bus is selected, and outputting the data on said first data bus when said second data bus is selected.

16. A method according to claim 15, further comprising the steps of setting said second data bus to a predetermined potential when said first data bus is selected, and setting said first data bus to a predetermined potential when said second data bus is selected.

* * * * *